United States Patent
Odry et al.

(10) Patent No.: US 10,794,977 B2
(45) Date of Patent: Oct. 6, 2020

(54) SYSTEM AND METHOD FOR NORMALIZED REFERENCE DATABASE FOR MR IMAGES VIA AUTOENCODERS

(71) Applicant: Siemens Healthcare GmbH, Erlangen (DE)

(72) Inventors: Benjamin L. Odry, West New York, NJ (US); Hasan Ertan Cetingul, Fulton, MD (US); Boris Mailhe, Plainsboro, NJ (US); Mariappan S. Nadar, Plainsboro, NJ (US); Xiao Chen, Princeton, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 161 days.

(21) Appl. No.: 15/629,779

(22) Filed: Jun. 22, 2017

(65) Prior Publication Data
US 2017/0371017 A1 Dec. 28, 2017

Related U.S. Application Data

(60) Provisional application No. 62/353,740, filed on Jun. 23, 2016.

(51) Int. Cl.
*G01R 33/56* (2006.01)

(52) U.S. Cl.
CPC ..... *G01R 33/5608* (2013.01); *G01R 33/5602* (2013.01)

(58) Field of Classification Search
None
See application file for complete search history.

(56) References Cited

U.S. PATENT DOCUMENTS

| | | | |
|---|---|---|---|
| 2015/0302599 A1* | 10/2015 | Crainiceanu | G06T 7/0012 382/131 |
| 2016/0093050 A1* | 3/2016 | Kim | G06K 9/36 382/128 |
| 2017/0100078 A1* | 4/2017 | Han | G16H 50/50 |
| 2017/0337682 A1* | 11/2017 | Liao | G06T 7/30 |
| 2018/0325461 A1* | 11/2018 | Carroll | A61B 5/055 |

\* cited by examiner

*Primary Examiner* — Douglas X Rodriguez

(57) ABSTRACT

A system and method including receiving magnetic resonance (MR) imaging data from a first MR scanner device, the MR imaging data including data for a plurality of MR scans of different structural or anatomical regions; generating, based on the MR imaging data, normalized reference data including statistical information for each MR scan; learning a transformation, based on the normalized reference data, to correlate a set of input MR imaging data to the normalized reference data; and storing a record of the transformed imaging data.

16 Claims, 6 Drawing Sheets

400

```
┌─────────────────────────────────────────┐
│  RECEIVE MAGNETIC RESONANCE (MR) IMAGING │
│  DATA FROM A FIRST MR SCANNER DEVICE, THE│
│    MR IMAGING DATA INCLUDING DATA FOR A  │
│     PLURALITY OF MR SCANS OF DIFFERENT   │
│    STRUCTURAL OR ANATOMICAL REGIONS      │
│                                      405 │
└─────────────────────────────────────────┘
                     │
                     ▼
┌─────────────────────────────────────────┐
│  GENERATE, BASED ON THE MR IMAGING DATA, │
│ NORMALIZED REFERENCE DATA INCLUDING STATISTICAL│
│    INFORMATION FOR EACH MR SCAN          │
│                                      410 │
└─────────────────────────────────────────┘
                     │
                     ▼
┌─────────────────────────────────────────┐
│    LEARN A TRANSFORMATION, BASED ON THE  │
│   NORMALIZED REFERENCE DATA, TO CORRELATE A│
│    SET OF INPUT MR IMAGING DATA TO THE   │
│       NORMALIZED REFERENCE DATA          │
│                                      415 │
└─────────────────────────────────────────┘
                     │
                     ▼
┌─────────────────────────────────────────┐
│  STORE A RECORD OF THE TRANSFORMED IMAGING DATA│
│                                      420 │
└─────────────────────────────────────────┘
```

*FIG. 4*

SYSTEM AND METHOD FOR NORMALIZED REFERENCE DATABASE FOR MR IMAGES VIA AUTOENCODERS

CROSS REFERENCE TO RELATED APPLICATIONS

This application claims benefit of, and priority to, U.S. Provisional Patent Application Ser. No. 62/353,740 filed on Jun. 23, 2016, the contents of which are hereby incorporated by reference in their entirety for all purposes.

BACKGROUND

Typically, magnetic resonance (MR) images of human body structures, such as tissues, organs, bones, etc. can present significant intensity variations across patients and scanners. The variations may be due not only to protocol differences but also calibration and inherent singularities between scanners and/or vendors. Accordingly, training classifiers or any type of machine/deep learning based approaches can yield unexpectedly poor results.

Different approaches for image standardization have been proposed. Some of said approaches are with respect to local estimation of tissues and image correction, whereas some are intended to eliminate or reduce artifacts or effect(s) of bias field. In some regards, such serial pipelines have become a standard in preprocessing MR images.

It is therefore desirable to have efficient and effective techniques for generating standardized images for MR images.

BRIEF DESCRIPTION OF THE DRAWINGS

The construction and usage of embodiments will become readily apparent from consideration of the following specification as illustrated in the accompanying drawings, in which like reference numerals designate like parts, and wherein:

FIG. 4 is a flow diagram of another process according to some embodiments;

DETAILED DESCRIPTION

A brief description of image acquisition using the NMR (nuclear magnetic resonance) phenomenon will now be provided. If a substance such as human tissue is subjected to a uniform magnetic field (i.e., polarizing field $B_0$), the individual magnetic moments of the nuclear spins in the tissue attempt to align with this polarizing field but precess about the field in random order at their characteristic Larmor frequency. Usually the nuclear spins comprised of hydrogen atoms are desired for clinical imaging, but other NMR-active nuclei are also occasionally used. A net magnetic moment $M_z$ is produced in the direction of the polarizing field, and the randomly-oriented magnetic components in the perpendicular, or transverse, plane (x-y plane) cancel one another.

If, however, the substance is subjected to a magnetic field which is in the x-y plane (i.e., excitation field $B_1$; also referred to as a radiofrequency (RF) field) and which is near the Larmor frequency, the net aligned moment, $M_z$, may be rotated, or "tipped" into the x-y plane to produce a net transverse magnetic moment $M_t$, which is rotating, or spinning, in the x-y plane at the Larmor frequency. A signal is emitted by the excited spins after the excitation field $B_1$ is terminated. The emitted signals are detected, digitized and processed to reconstruct an image using one of many well-known MR reconstruction techniques.

Figure 1:
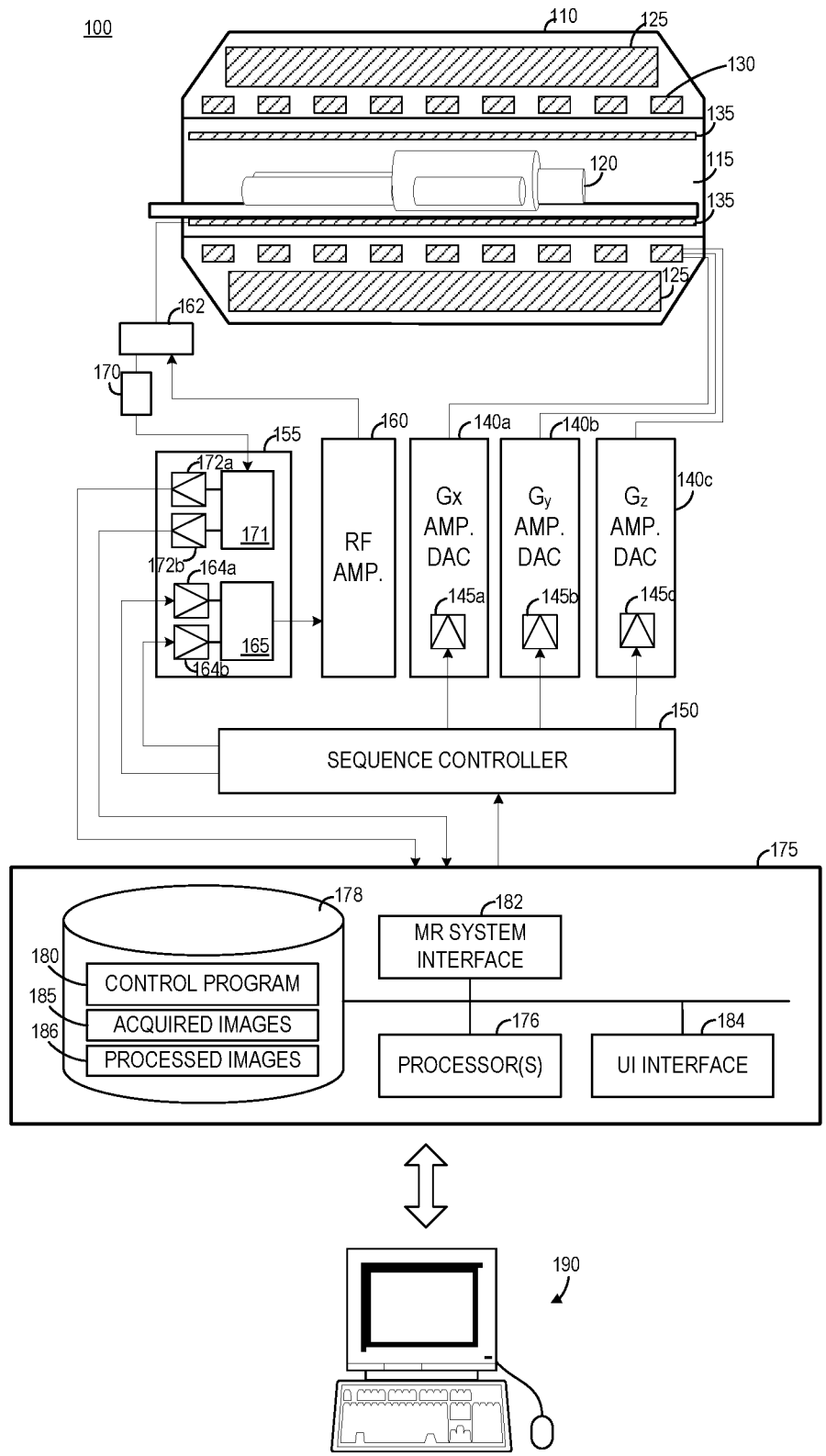
FIG. 1 is a block diagram of an MRA system according to some embodiments.

FIG. 1 illustrates magnetic resonance imaging (MRI) system 100 according to some embodiments. MRI system 100 includes MRI chassis 110 that defines a bore 115 in which patient 120 is disposed. MRI chassis 110 includes polarizing main magnet 125, gradient coils 130, and RF coil 135 arranged about bore 115. According to some embodiments, polarizing main magnet 125 generates the uniform magnetic field $B_0$ mentioned above and RF coil 135 emits the excitation field $B_1$.

Gradient coils 130 produce magnetic field gradients $G_x$, $G_y$, and $G_z$ which are used for position-encoding NMR signals. The magnetic field gradients $G_x$, $G_y$, and $G_z$ distort the main magnetic field in a predictable way so that the Larmor frequency of nuclei within the main magnetic field varies as a function of position. Accordingly, an excitation field $B_1$ which is near a particular Larmor frequency will tip the net aligned moment $M_z$ of those nuclei located at field positions which correspond to the particular Larmor frequency, and signals will be emitted only by those nuclei after the excitation field $B_1$ is terminated.

Gradient coils 130 may consist of three windings, for example, each of which is supplied with current by an amplifier 140a-140c in order to generate a linear gradient field in its respective Cartesian direction (i.e., x, y, or z). Each amplifier 140a-140c includes a digital-analog converter 145a-145c that is controlled by a sequence controller 150 to generate desired gradient pulses at proper times.

Sequence controller 150 also controls the generation of RF pulses by RF system 155. RF system 155 is responsive to a scan prescription and direction from sequence controller 150 to produce RF pulses of the desired frequency, phase, and pulse amplitude waveform. The generated RF pulses may be applied to the whole of RF coil 135 or to one or more local coils or coil arrays. RF coil 135 converts the RF pulses emitted by RF amplifier 160, via multiplexer 162, into a magnetic alternating field to excite the nuclei and align the nuclear spins of the object to be examined or the region of the object to be examined.

The RF pulses to be produced by RF system 155 are represented digitally as complex numbers. Sequence controller 150 supplies these numbers in real and imaginary parts to digital-analog converters 164a-164b in RF system 155 to create corresponding analog pulse sequences. Transmission channel 165 modulates the pulse sequences with a radio-frequency carrier signal having a base frequency corresponding to the resonance frequency of the nuclear spins in the volume to be imaged.

RF coil 135 both emits the radio-frequency pulse to excite nuclear spins and scans the alternating field which is produced because of the precessing nuclear spins, i.e. the nuclear spin echo signals. The received signals are received by multiplexer 162, amplified by RF amplifier 170 and demodulated in receiving channel 171 of RF system 155 in a phase-sensitive manner. Analog-digital converters 172*a* and 172*b* convert the demodulated signals into a real part and an imaginary part.

Computing system 175 receives the real and imaginary parts and reconstructs an image therefrom per known techniques. System 175 may comprise any general-purpose or dedicated computing system. Accordingly, system 175 includes one or more processing units 176 (e.g., processors, processor cores, execution threads, etc.) configured to execute processor-executable program code to cause system 175 to operate as described herein, and storage device 178 for storing the program code. Storage device 178 may comprise one or more fixed disks, solid-state random access memory, and/or removable media (e.g., a thumb drive) mounted in a corresponding interface (e.g., a USB port).

Storage device 178 stores program code of control program 180. One or more processing units 146 may execute control program 180 to cause system 175 to perform any one or more of the processes described herein. For example, one or more processing units 146 may execute control program 180 to cause system 175 to receive the real and imaginary parts of a received RF signal via MR system interface 182 and reconstruct an image therefrom according to known techniques. Such an image may be stored among acquired images 185 of storage device 178. Control program 180 may also be executed to process one or more reconstructed images as described herein, and to store a processed image among processed images 186 of storage device 178.

One or more processing units 146 may also execute control program 180 to provide instructions to sequence controller 150 via MR system interface 182. For example, sequence controller 150 may be instructed to initiate the desired pulse sequences and corresponding scanning of k-space (i.e., acquired signal data). In particular, sequence controller 150 may be instructed to control the switching of magnetic field gradients via amplifiers 140*a*-140*c* at appropriate times, the transmission of radio-frequency pulses having a defined phase and amplitude via RF system 155 and RF amplifier 160, and the reception of the resulting magnetic resonance signals.

Acquired images 185 and/or processed images 186 may be provided to terminal 190 via UI interface 184 of system 175. UI interface 184 may also receive input from terminal 190, which may be used to provide commands to control program 180 to control sequence controller 150 and other elements of system 100. Terminal 190 may simply comprise a display device and an input device coupled to system 175. In some embodiments, terminal 190 is a separate computing device such as, but not limited to, a desktop computer, a laptop computer, a tablet computer, and a smartphone.

Each element of system 100 may include other elements which are necessary for the operation thereof, as well as additional elements for providing functions other than those described herein. Storage device 178 may also store data and other program code for providing additional functionality and/or which are necessary for operation of system 175, such as device drivers, operating system files, etc. In some embodiments, storage device 178 may comprise an instance of a database (e.g., a database node of a distributed database system).

In some contexts and use-cases, MR images may contain significant (i.e., non-trivial) intensity variations across different patients and different scanners. Such intensity variations might, for example, even exist in MR images generated by MR systems of a same model number located in different hospitals. Intensity variances may be attributable to differences in protocols, scanner calibrations, technician biases/preferences, etc. that can cause differences in the MR images obtained by the two different scanners. These differences may cause a problem in interpreting and evaluating the MR images since the distribution of intensities of the images is not consistent in the data obtained from different patients and different scanners at different times and operated by different technicians.

In some aspects, the present disclosure includes a system and method to create a normalized image database. In some embodiments, MR image data may be obtained any scanner and processed according to the processes disclosed herein to obtain MR images with normalized intensities such that, for example, the normalized MR images can be evaluated relative to a consistent intensity distribution.

As an illustrative example, MR images with normalized intensities of a brain can be accurately viewed/interpreted knowing (i.e., given) the intensity of white matter in the MR images is between a given intensity range and grey matter will be within a second (different) intensity range. In this example, variances in intensities due to different scanners, calibrations, technicians, times, patients, scanned organs and structural anatomies, and combinations thereof might be minimized and different images with a similar/same intensity distribution can be compared by the use of the MR images with normalized intensities.

Figure 2:
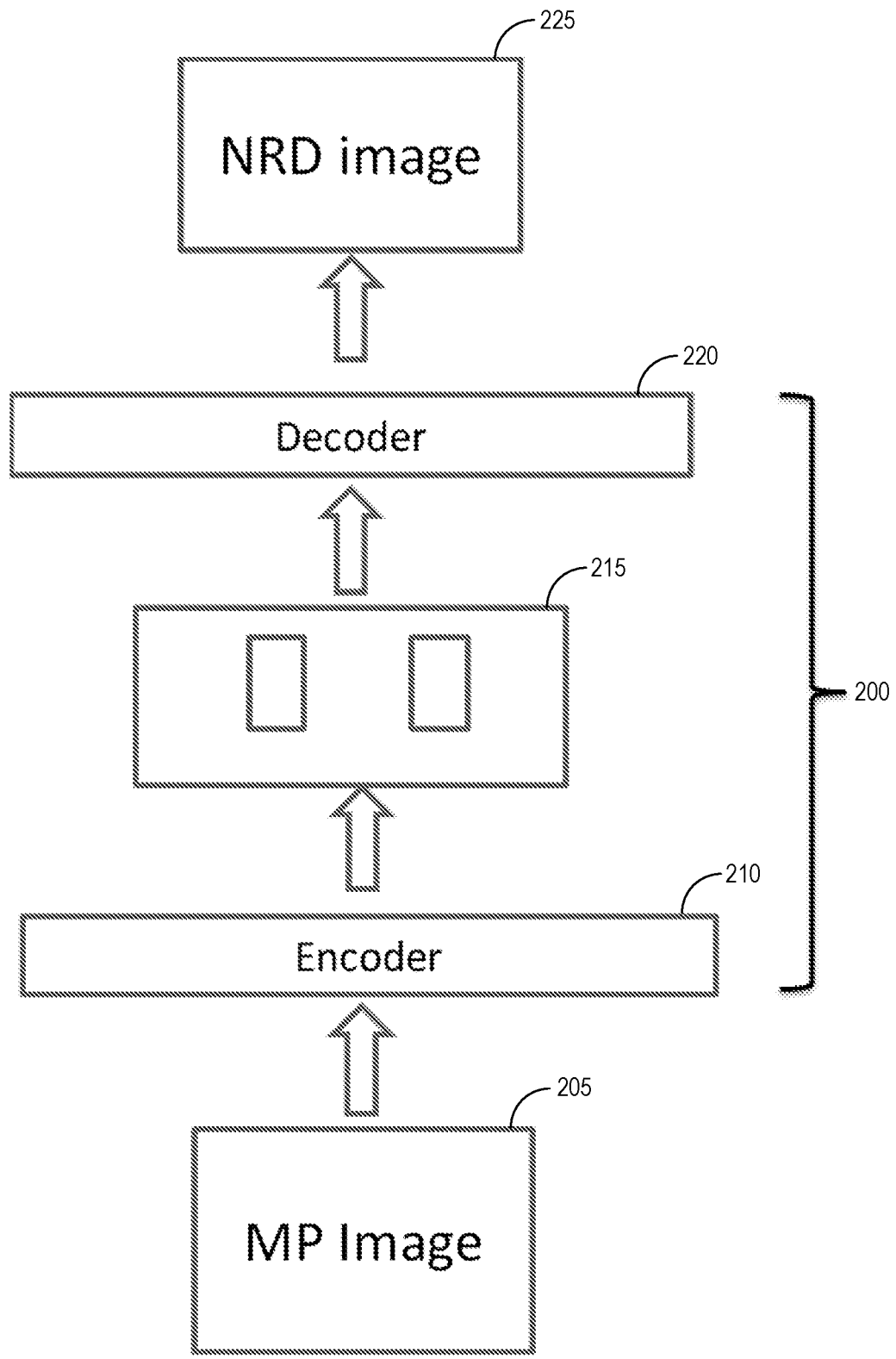
FIG. 2 is an illustrative example of an autoencoder.

FIG. 2 is an illustrative example of an autoencoder 200, that may be used in some embodiments of the present disclosure. In some embodiments, autoencoder 200 is a variational autoencoder (VAE). It is noted however that autoencoder need not be a VAE type of autoencoder. As will be described in greater detail below, VAE 200 might be used by a system or in a process to generate normalized imaging data in accordance with some embodiments related to a neural network. VAE 200 may be described as a hidden layer in the neural network. VAE 200 comprises multiple layers, including an encoder 205, a latent space 215 of random variables (z), and a decoder 220.

Figure 3:
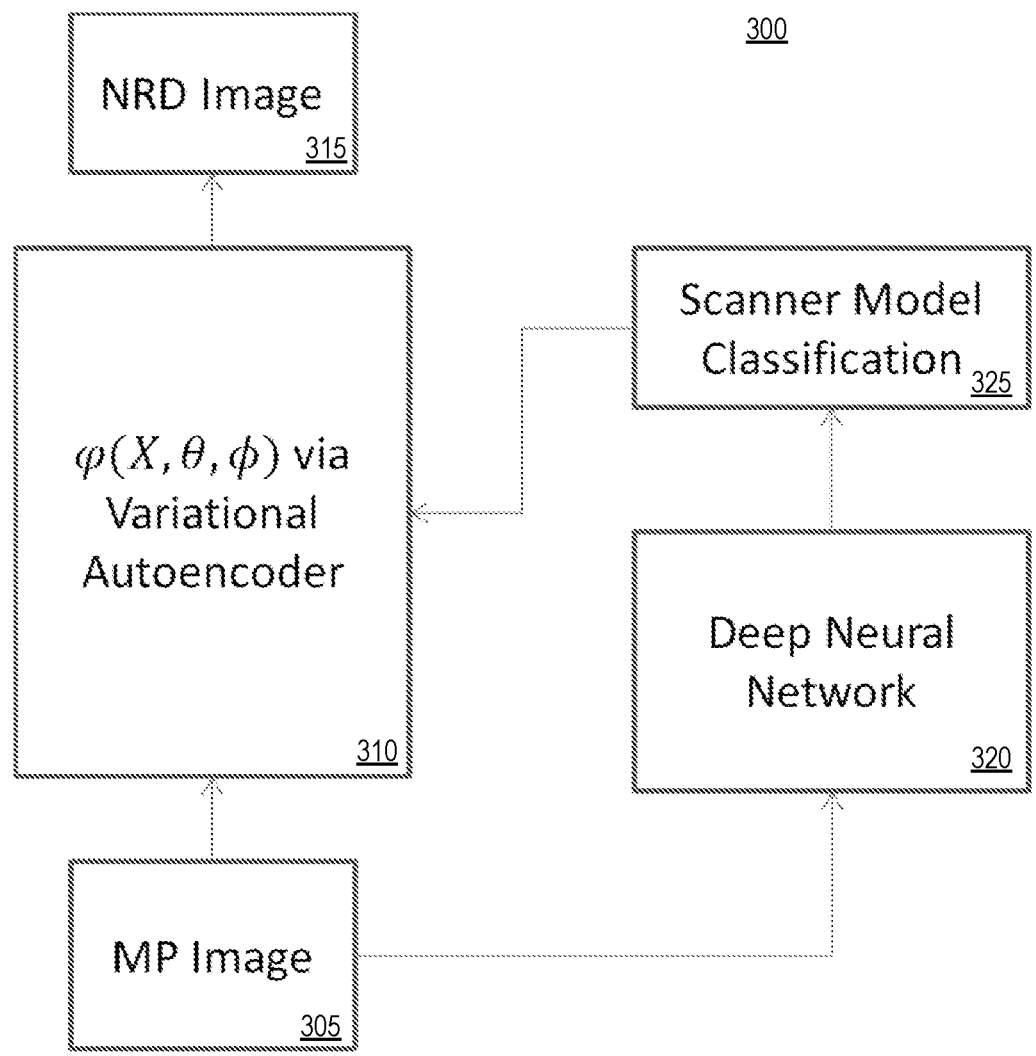
FIG. 3 is a flow diagram of a process according to some embodiments.

The input to encoder 210 in the example of FIG. 2 is MP (multiparametric) MR images 205 (i.e., a sequence of functional forms of imaging such as, for example, T1, T2, FLAIR, etc.). The MP images 205 include a sequence of images or data points (x) and its output from encoder 210 is a hidden representation (z), with certain weights and biases ($\theta$). Encoder 210 encodes the MP images into the latent space (z) 215. The encoder may be represented by $q_\theta(z|x)$. Decoder 220 receives, as an input, the hidden representation (z). Herein, the latent space focuses on having two random variables, independent layers that represent the mean and STD of the input intensity distribution. Decoder 220 learns to reconstruct an image based on the statistics of the latent space 215. Decoder 220 outputs the parameters to a probability distribution of the data, with weights and biases $\phi$. The encoder may be represented by $q_\phi(x|z)$. The output of decoder in the example of FIG. 3 is normalized reference database (NRD) image 225 representations of the MP images 205.

In some embodiments, MP images 205 include a large-scale dataset of images acquired using a single specific scanner. The NRD image or reference database is generated with statistical information on, for example, each tissue/organ in the MP scans. In some aspects, a representation of each tissue/organ can be computed using multiple scans of multiple individuals (e.g., volunteers), normalizing the representation data, and averaging over it over the total number of scans to create the NRD images 225. In some aspects, the NRD may be considered as the set of images that an atlas is averaged from, such atlas containing shape information and intensity distribution information of labeled structural or anatomical regions (i.e., tissue/organs).

NRD image 225 representations are normalized for the set of MP images 205 so that a reference level of intensities can be obtained, generated, or otherwise determined. The reference level of intensities of the NRD images can be, in some instances, uses a standard or measure against which other MR images can be compared or evaluated for normal and/or problematic intensities.

In some embodiments, the NRD images or data can be used to establish a "normal" range of image intensities, where other intensities outside of the "normal/healthy" range in a MR image might indicate a problem with the scanned tissue or organ represented in the MR image. As an example, a normalized database of MR images for a particular anatomical region might be used to establish a range of expected intensities for "normal/healthy" tissue in the region. Intensity values outside of the expected intensity range might indicate a tumor, lesion, or other abnormality in the subject tissue/organ region of the MR image.

In accordance with some aspects herein, the present disclosure relates to a system and a process to normalize MR image data, and create a reference database of tissue/organ MR images for comparison/evaluation of MR images to the reference database.

In some aspects, advances in deep-learning generative models may be used to facilitate evaluating and reconstructing images based on a provided, specific target. In the context of the present disclosure, the target is a normalized database of MR images. In some embodiments, an autoencoder such as a VAE (though not limited to a VAE) may be used in a process and a system to learn a transformation $\varphi(X,\theta)$ that takes MR images as an input and match those input images to the normalized database of MR images (i.e., the target).

FIG. 3 is an illustrative depiction of a system 300, in accordance with some embodiments herein. System 300 may include more or other components than those explicitly depicted in FIG. 3. While FIG. 3 is shown as comprising a number of discrete components, FIG. 3 may represent a logical embodiment of a system, where some functions might be implemented by one or more devices and/or multiple functionalities might be executed by one device. FIG. 3 includes a VAE 310 that receives MP images 305 as an input thereto. VAE 310 may facilitate learning a transformation, $\varphi(X,\theta,\phi)$ from an MR image (e.g., from any scanner) to an image normalized to a reference database (i.e., NRD image 315).

Regarding the transformation function of the VAE, we define a score $X=(x_1, \ldots, x_n)$ with $x_i$ representing a contrast image out of n possible, i.e. T1, T2, FLAIR, etc. A function $\varphi(X,\theta,\phi)$ is trained, where X is the multiparametric image and B is the model parameter that is going to produce the normalization data such that a predicted image $X^*=\varphi(X,\theta,\phi)$. Herein, we train a VAE to estimate $\varphi$ and obtain optimal network parameters using a cross-entropy loss function with deterministic decoder network.

In some embodiments, images are encoded into continuous latent variables $q_\phi(z|x)$, which are in turn decoded to map to NRD images $p_\theta(z|x)$. The loss function may be represented as: $\varphi(x_i,\theta,\phi)=-D_{KL}(q_\theta(z|x)\|p_\theta(z))+E_{q_\phi(z|x_i)}[\log(p_\theta(x_i|z))]$, where the first term represents the divergence between the encoder's distribution $q_\theta(z|x)$ and $p(z)$ and the second term represents a reconstruction loss.

In some aspects, the transformation from MP image 305 to NRD image 315 may be accomplished in, for example, two ways herein. A normalized database may be created and (1) a neural network using a VAE (e.g., 310) may be used to learn the transformation and (2) a deep-learning based neural network 320 that identifies attributes of the MP image, such as the acquisition source (i.e., scanner) of the image, which can be used by the VAE to further refine the creation of the normalized database (e.g., using the scanner model classification 325).

In some embodiments, MP image 305 is fed to deep-learning neural network 320 that learns (or at least attempts to learn) where the MP image originates. In particular, deep neural network 320 may determine the vendor and magnetic field strength of the MP image. Scanner model classification module 325 may generate scanner-specific information that may be provided to VAE 310 as priors to the VAE to improve the intensity matching thereof.

In some embodiments, a classification approach to discriminate scanner types and vendors to learn a second or an inverse transformation to match intensities to the NRD is a derived operation. In some instances, based on an input to the NRD with a known vendor and magnetic field configuration (i.e., labeled data) and that input's impact on the transformation, a classification metric can be derived by learning or recognizing which scanners/vendors are input to the network or system 300. That is, a second transformation herein may be used to go from NRD to a specific scanner type/vendor (i.e., determine model- or scanner-specific information), where a specific scanner type/vendor corresponds to a specific distribution type.

In some embodiments, scanner information may be used as prior as well. After training is done, NRD image will include features that are independent to scanner variations and will thus reflect the best image.

In some embodiments, the transformation learning process can be implemented in at least one of an organ-based form and an intensity-based form. With the organ-based form, a NRD database for a specific organ is generated and the intensity distribution of images of the same organ (e.g., the brain) can be matched to the reference database images to a brain-specific NRD. In the case of the intensity-based form, the intensity distribution of a subject image may, without spatial information or context, be mapped or correlated to that of the NRD reference database.

In some aspects, notwithstanding the particular method(s) of the transformation learning, training may be accomplished using a large database of MR images acquired from multiple scanners with multiple magnetic fields (1.5 T, 3 T, 7 T) from different vendors. In some embodiments and possibly as an option where improved intensity matching accuracy might be achieved, transformations might be separated based on at least one of a scanner vendor, magnetic field strength, and receive coil array. Examples can include transformations for different configurations of MR scanners such as Siemens/1.5 T, Siemens/3 T, GE/1.5 T, GE/3 T, etc.

FIG. 4 is a flow diagram of a process 400, according to some embodiments herein. Process 400 is related to a method that might be executed by, for example, system 300 in FIG. 3 where MP images 305 are processed through an encoder (e.g., VAE 310) to generate a normalized reference database including NRD images 315. At operation 405, MR imaging data from a first scanner device is received. The MR imaging data may include data pertaining to a large dataset of different structural or anatomical regions. In some embodiments, the MR imaging data may comprise sequences of functional images, as opposed to singular images.

Operation 410 includes generating normalized reference data based on the MR imaging data received at operation 405. The normalized reference data may be labeled or otherwise identifiable for each MR scan.

At operation 415, a transformation is learned or otherwise determined, based on the normalized reference data of operation 410. The transformation may operate to match, map, or otherwise correlate a set (i.e., one or more) of input MR images to the normalized reference data determined at operation 410.

Proceeding to operation 420, a record of the transformed imaging data may be stored. The stored data may be further processed, viewed, or reported, and can be configured as any now known or future developed data structure.

Figure 5:
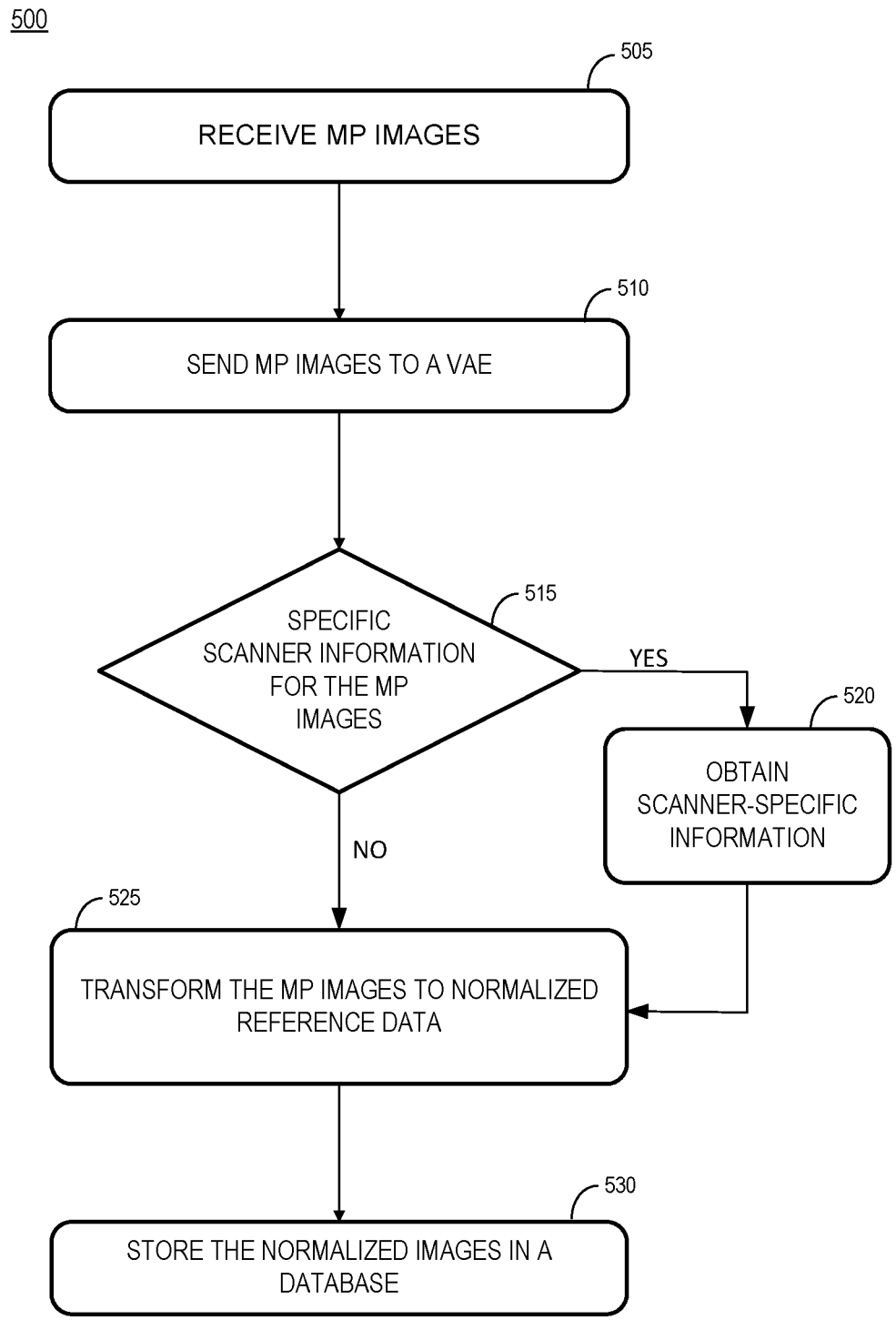
FIG. 5 is a flow diagram of a process, according to some embodiments.

FIG. 5 is a flow diagram of a process 500, according to some embodiments herein. Process 500, in some embodiments, is related to a method that might be executed by, for example, system 300 in FIG. 3 where MP images 305 might be processed through a neural/learning network (e.g., deep neural network 320) and a classification operation (e.g., scanner model classification module 325). At operation 505, MR imaging data from a first scanner device is received and the MP images are forwarded to an encoder at operation 510.

At operation 515, a determination is made whether scanner-specific information corresponding to the MP images is available. The scanner-specific information, if available for the input MP images may, in some instances, be used to improve an accuracy of an intensity matching operation, the efficiency of performing such an operation, combinations thereof, and for other purposes. The determination of operation 515 may be executed, in some instances, by a query of a database (not shown in FIG. 5). In the instance there is scanner-specific information available corresponding to the input MP images, process 500 proceeds to operation 520 where such scanner-specific information is obtained.

Once obtained, the scanner-specific information may be used in a transformation operation 525. Again, use of the scanner-specific information in transformation operation 525 may benefit an accuracy, efficiency, and other aspects thereof.

Referring to operation 515 and the instance where there is no relevant scanner-specific information available corresponding to the input MP images received by the VAE at operation 510, process 500 may advance directly to the transformation operation 525.

At operation 530, the normalized images determined or otherwise generated at operation 525 may be stored in a data storage facility or device, such as, for example, a database. The normalized data may be used in other processes, including but not limited to medical treatment plans, data analytics, data visualizations, and other tasks.

The MR imaging data may include data pertaining to a large dataset of different structural or anatomical regions. In some embodiments, the MR imaging data may comprise sequences of functional images, as opposed to singular images.

Figure 6:
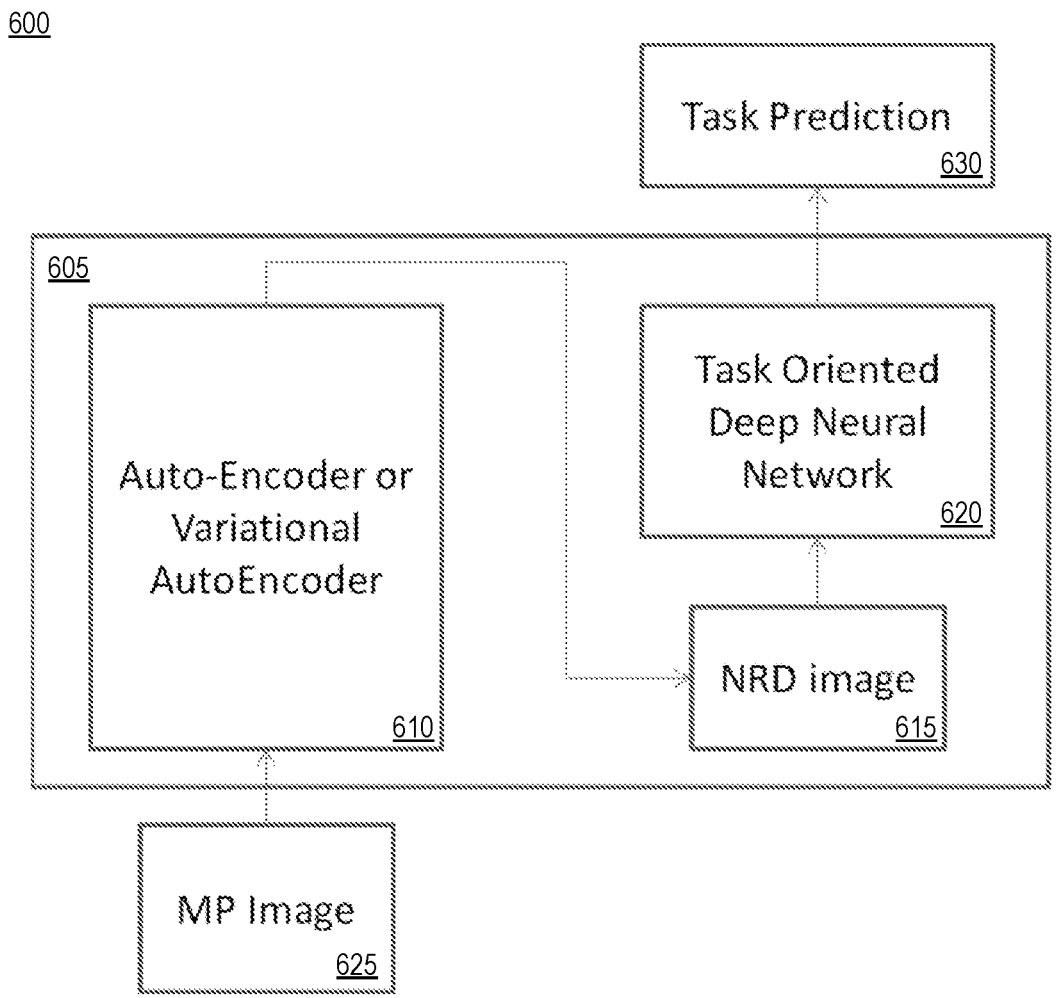
FIG. 6 is a system diagram of a task network including some aspects of a normalization network, according to some embodiments.

In some embodiments, a normalized image generator in accordance with some aspects herein might be used in or otherwise comprise a part of a larger task (e.g., quantification) network. FIG. 6 is an illustrative example where some aspects of the present disclosure discussed hereinabove are incorporated or embedded in a system 600. System 600 may include a combined network 605 comprising a normalization network 610 and a task oriented network 620. Normalization network 610 may operate to generate NRD images 615 given an input of MP images 625, in accordance with some aspects herein. Task oriented network 620 may operate to generate a prediction 630 given an input NRD image 615. Task oriented network 620 might be a deep-learning neural network directed to segmentation or region classification based on normalized MR images. For example, task network 620 might be designed to extract images of a brain (or liver) from an image of a head (torso body part).

Those in the art will appreciate that various adaptations and modifications of the above-described embodiments can be configured without departing from the scope and spirit of the claims. Therefore, it is to be understood that the claims may be practiced other than as specifically described herein.

What is claimed is:

1. A method comprising:
receiving magnetic resonance (MR) imaging data from a first MR scanner device, the received MR imaging data including data for a plurality of MR scans of different structural or anatomical regions;
generating, based only on the received MR imaging data, normalized reference data including statistical information for each MR scan, wherein generating comprises transforming an MR image based on the received MR imaging data to a normalized reference data image as the normalized reference data;
learning the transformation, based on the generated normalized reference data, to train a neural network to correlate other MR imaging data from a second MR scanner device to the normalized reference data, wherein the learning of the transformation is segregated based on a MR scanner vendor, a magnetic field strength, or the MR scanner vendor and the magnetic field strength associated with the other MR imaging data; and
storing a record of the transformed imaging data, the transformed imaging data being data corresponding to the MR image transformed to the normalized reference data image.

2. A method according to claim 1, wherein the statistical information for each MR scan includes, at least, shape information and intensity distribution for labeled representations of the different structural or anatomical regions.

3. A method according to claim 1, wherein the received MR imaging data represents multiparametric MR images.

4. A method according to claim 1, wherein the transforming comprises processing the received MR imaging data through an autoencoder.

5. A method according to claim 4, wherein the autoencoder is a variational autoencoder.

6. A method according to claim 1, wherein the learning of the transformation to train the neural network to correlate the other MR imaging data from the second MR scanner device to the normalized reference data is at least one of:
organ based, wherein an intensity distribution of a specific organ for the other MR imaging data is correlated to normalized reference data for the specific organ; and
intensity based, wherein an intensity distribution of a specific MR image of the other MR imaging data is correlated to an intensity distribution of the normalized reference data.

7. A method according to claim 1, further comprising:
determining a classification of at least one of a model and a field strength distribution for the other MR imaging data based on a scanner type used to generate the other MR imaging data; and
learning a second transformation to correlate the classified MR imaging data to the normalized reference data.

8. A method according to claim 1, wherein the normalized reference data is stored in a database.

9. A system comprising:
a chassis defining a bore;

a main magnet to generate a polarizing magnetic field within the bore;

a gradient system to apply a gradient magnetic field to the polarizing magnetic field;

a radio frequency system to apply an excitation pulse to patient tissue disposed within the bore and to receive signals from the patient tissue; and a computing system to receive the signals from the RF system, the computing system to execute program code to:

receive magnetic resonance (MR) imaging data from a first MR scanner device, the received MR imaging data including data for a plurality of MR scans of different structural or anatomical regions;

generate, based only on the received MR imaging data, normalized reference data including statistical information for each MR scan, wherein to generate the normalized reference data the computing system executes program code to transform an MR image based on the received MR imaging data to a normalized reference data image;

learn the transformation, based on the generated normalized reference data, to train a neural network to correlate other MR imaging data from a second MR scanner device to the normalized reference data, wherein the learning of the transformation is segregated based on a MR scanner vendor, a magnetic field strength, or the MR scanner vendor and the magnetic field strength associated with the other MR imaging data; and store a record of the transformed imaging data, the transformed imaging data being data corresponding to the MR image transformed to the normalized reference data image.

10. A system according to claim 9, wherein the statistical information for each MR scan includes, at least, shape information and intensity distribution for labeled representations of the different structural or anatomical regions.

11. A system according to claim 9, wherein the received MR imaging data represents multiparametric MR images.

12. A system according to claim 9, wherein the transforming comprises processing the received MR imaging data through an autoencoder.

13. A system according to claim 12, wherein the autoencoder is a variational autoencoder.

14. A system according to claim 9, wherein the learning of the transformation to train the neural network to correlate the other MR imaging data from the second MR scanner device to the normalized reference data is at least one of:

organ based, wherein an intensity distribution of a specific organ for the other MR imaging data is correlated to normalized reference data for the specific organ; and intensity based, wherein an intensity distribution of a specific MR image of the other MR imaging data is correlated to an intensity distribution of the normalized reference data.

15. A system according to claim 9, further comprising:

determining a classification of at least one of a model and a field strength distribution for the other MR imaging data based on a scanner type used to generate the other MR imaging data; and learning a second transformation to correlate the classified MR imaging data to the normalized reference data.

16. A system according to claim 9, wherein the normalized reference data is stored in a database.

\* \* \* \* \*